United States Patent
Lee

(10) Patent No.: US 6,525,577 B2
(45) Date of Patent: Feb. 25, 2003

(54) APPARATUS AND METHOD FOR REDUCING SKEW OF A HIGH SPEED CLOCK SIGNAL

(75) Inventor: Joonsuk Lee, Seoul (KR)

(73) Assignee: International Business Machines Corporation, Armonk, NY (US)

( * ) Notice: Subject to any disclaimer, the term of this patent is extended or adjusted under 35 U.S.C. 154(b) by 28 days.

(21) Appl. No.: 09/731,811

(22) Filed: Dec. 8, 2000

(65) Prior Publication Data

US 2002/0095628 A1 Jul. 18, 2002

(51) Int. Cl.[7] .................................................. H03L 7/06
(52) U.S. Cl. ........................................ 327/149; 327/158
(58) Field of Search .................................. 327/156, 153, 327/149, 150, 158, 159, 161, 163

(56) References Cited

U.S. PATENT DOCUMENTS

| 5,384,781 A | | 1/1995 | Kawabata ........................ 371/1 |
| 5,394,024 A | | 2/1995 | Buckenmaier et al. ........ 327/160 |
| 5,668,503 A | | 9/1997 | Gersbach et al. ............. 331/1 A |
| 5,893,054 A | * | 4/1999 | White ............................ 702/189 |
| 6,101,137 A | | 8/2000 | Roh ............................... 327/156 |
| 6,121,815 A | * | 9/2000 | Terada et al. ................. 327/141 |
| 6,157,229 A | * | 12/2000 | Yoshikawa ..................... 327/147 |
| 6,166,572 A | * | 12/2000 | Yamaoka ....................... 327/149 |
| 6,215,361 B1 | * | 4/2001 | Lebouleux et al. ............ 327/157 |
| 6,239,627 B1 | * | 5/2001 | Brown et al. ................. 327/116 |
| 6,289,068 B1 | * | 9/2001 | Hassoun et al. .............. 327/156 |

OTHER PUBLICATIONS

"A 2–1600MHz 1.2–2.5V CMOS Clock–Recovery PLL with Feedback Phase–Selection and Averaging Phase–Interpolation for Jitter Reduction," Patrik Larsson, Bell Labs, Lucent Technologies, Holmdel, NJ, *1999 IEEE International Solid–State Circuits Conference, Digest of Technical Papers*, pp. 356–357.

Nash, "Phase–Locked Loop Design Fundamentals", AN535 Application Note, Motorola Inc. 1994, Motorola Literature Distribution, Phoenix, AZ., pp. 1–12.

* cited by examiner

Primary Examiner—Kenneth B. Wells
Assistant Examiner—Cassandra Cox
(74) Attorney, Agent, or Firm—Connolly Bove Lodge & Hutz LLP; Joseph P. Abate

(57) ABSTRACT

Apparatus and method for reducing clock skew. A compensator is connected to receive an uncorrected clock signal and delay the clock signal in accordance with a skew control voltage. The skew control voltage is derived from the signal to noise ratio of an analog signal produced by a device controlled by the clock signal. The skew control voltage changes step wise maintaining the system signal to noise at a minimum by reducing the clock skew.

11 Claims, 4 Drawing Sheets

APPARATUS AND METHOD FOR REDUCING SKEW OF A HIGH SPEED CLOCK SIGNAL

FIELD OF THE INVENTION

The present invention provides a circuit and method for reducing skew between a clock signal and a reference signal. Specifically, the circuit and method reduces the skew between a reference signal and the clock signal produced from a phase lock loop which utilizes the reference signal.

BACKGROUND OF THE INVENTION

Radio frequency communication systems utilize phase lock loop (PLL) circuits to produce a clock signal which control digital devices such as frequency synthesizers and digital to analog conversion circuits. The well known PLL circuit receives a reference signal and generates from a voltage controlled oscillator (VCO) a higher power clock signal which is phase and frequency locked to the reference signal.

In higher frequency applications above 1-GHz, a time delay exists between the reference signal and the VCO output signal which is referred to as skew. The skew can produce errors in the analog to digital conversion process, as well as reduce system performance in base station communications operations. The skew is a result of dynamic mismatches between circuit elements of the phase lock loop. Specifically, mismatches of transistors forming the phase detector and charge pump which establishes a control voltage for the voltage controlled oscillator introduce a phase error between the input reference signal and the VCO signal.

In applications which require the conversion of digital signals to analog signals, a slight clock skew will contribute significantly to the noise in a high resolution digital to analog converters. Even when the passive and active elements in the phase lock loop are matched, at 2-GHz a clock skew of 30 PS may still exist between the reference signal and VCO signal.

The prior art includes various techniques for reducing clock skew for a multi-channel signal source. U.S. Pat. No. 5,384,781 describes a cross-coupled flip-flop calibration circuit and microprocessor which aligns the timing of a pair of signals from a multi-channel signal source. The flip-flop calibration circuit indicates which of a pair of signals is leading in phase, and the microprocessor uses the output of the flip-flop circuit to adjust a signal delay for one of the signal sources. By changing the delay of the leading signal, a calibrated value can be obtained wherein both signals have essentially the same timing.

U.S. Pat. No. 5,394,024 provides a circuit for eliminating off chip to on chip clock skew. An on chip clock signal is derived by phase delaying an off chip generated clock signal. First and second delay paths are connected to receive the off chip clock signal. A phase detector and filter circuit generates control signals to adjust the respective phase delay through each of the delay paths. A multiplexer selects one of the delay paths to produce the on chip clock signal.

The present invention is directed to providing a method for calibrating a VCO generated signal with respect to a sine wave reference signal to reduce the skew between the VCO signal and the sine reference signal of the phase lock loop.

SUMMARY OF THE INVENTION

An apparatus and method are provided for correcting clock signal skew. A calibration circuit comprising a skew compensator is connected to receive an uncorrected clock signal, and delays the clock signal in accordance with a skew control voltage. The skew control voltage is derived from the signal to noise ratio of an analog signal produced from a device controlled by the clock signal. In a preferred embodiment of the invention, a digital analog converter produces a signal to noise ratio measurement signal which is representative of the skew of the clock signal. The signal to noise ratio signal is supplied as a control signal to a skew compensator, which affectively delays the clock signal in accordance with the applied control signal. The clock signal is shifted in time to produce a signal to noise ratio signal having a minimum value, representing a zero skew condition.

In accordance with a preferred embodiment of the invention, a source of sine wave reference signals is used in a sine digital to analog converter. The digital to analog converter produces Sine pulses having an area representing the value of a digital input signal. A signal representing the signal to noise ratio of the analog signal is produced from the digital to analog converter, representing the skew between an input clock signal and the sine wave reference signal. A skew controller receives the signal to noise ratio signal and generates the control signal for a variable delay network. The variable delay network delays the input signal in accordance with the signal to noise ratio signal derived from the digital to analog converter to eliminate the clock skew.

DESCRIPTION OF THE PREFERRED EMBODIMENT

Figure 1:
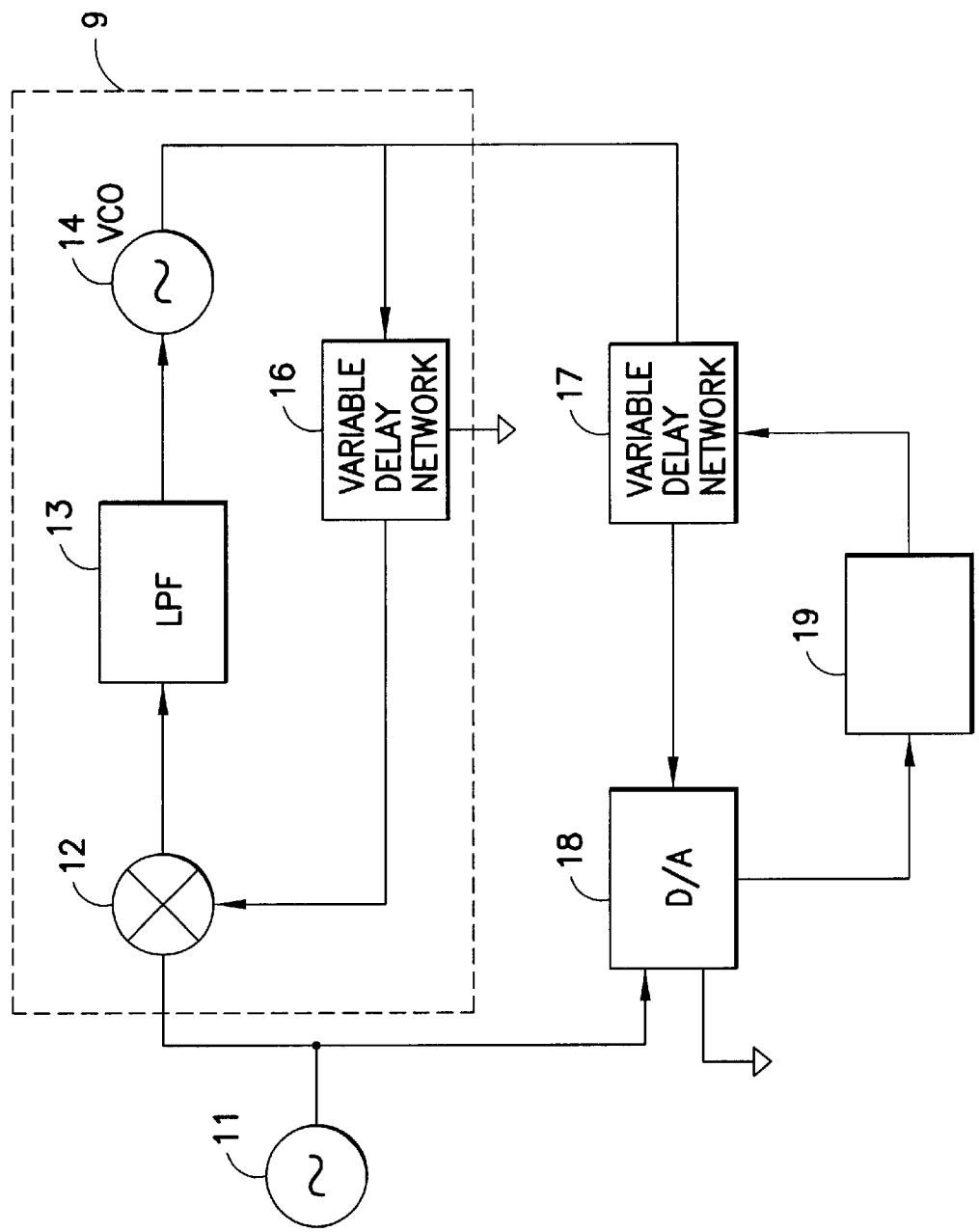
FIG. 1 is a block diagram of a skew calibration circuit in accordance with a preferred embodiment.
Figure 2:
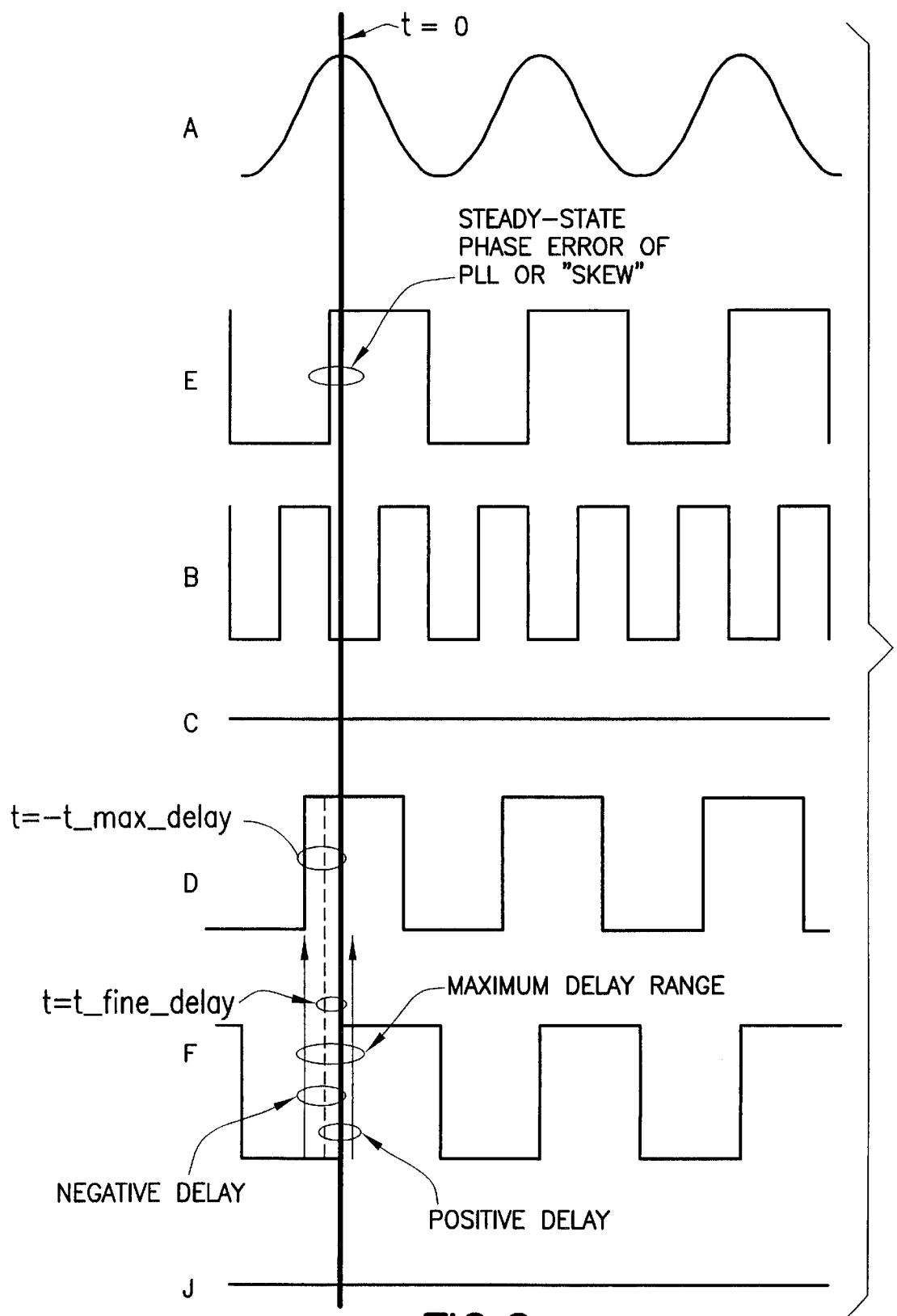
FIG. 2 illustrates the timing of signals used to calibrate the clock signal.

FIG. 1 illustrates (within dashed line) a phase lock loop circuit 9 which produces a clock signal phase locked to a source of sine wave signals 11. The source of sine wave signals 11 constitutes a reference frequency which, in accordance with the principle of phase lock loop operation, controls the operating frequency and phase of voltage control oscillator (VCO) 14. The voltage controlled oscillator 14 produces a clock signal which has a sufficient power output capability to drive a plurality of integrated circuit chips. As noted in the previous section, the phase of the clock signal produced by VCO 14 is delayed with respect to the phase of the reference signal oscillator 11, producing a skew between the two signals. Eliminating skew is desirable in high frequency communications systems which utilize digital to analog conversion devices, as the skew is responsible for an increase in signal to noise ratio for the digital to analog converter (DAC) where high resolution is sought. As will be evident with respect to the discussion of FIG. 2, the Sin DAC architecture is used in applications requiring a low signal to noise ratio output and a reduced sensitivity to clock jitter.

The portion of the phase lock loop 9 which includes a phase detector 12, low pass filter 13 and voltage control oscillator 14 is of a conventional design, having a loop bandwidth and performance selected for a specific application. Additionally, the phase lock loop 9 includes, in accordance with the present embodiment, a delay circuit 16 which introduces a fixed amount of delay between the clock signal from VCO 14 and the input of phase detector 12.

The fixed delay is used to change the time origin for the clock signal, and permit the clock signal delay to be shifted in time by a delay circuit 17, so that skew between the clock signal and reference signal can be reduced. The skew, or a relative time difference between the reference signal produced by Sine signal source 11, and the clock signal output from VCO 14, is shown in trace A and trace E of FIG. 2. A represents the sine reference signal from source 11, and E represents the input to the phase detector 12, which is a delayed version of D, the signal from voltage controlled oscillator 14. The error signal produced by phase detector 12, is filtered in filter 13 and is shown in C. The clock signal D produced from VCO 14 is illustrated as D in FIG. 2, and has a leading relationship with respect to the reference Sine signal A due to the delay imposed by delay circuit 16. Delay circuit 17 is controlled by a control voltage which, in accordance with the preferred embodiment, reduces the time difference between the signal F produced from the output of the voltage controlled delay circuit 17 and the Sine reference signal from reference signal source 11.

The delay circuit 16 similar to delay circuit 17 has the input control voltage set at a common potential, so that $V_{con}$ is fixed, providing a fixed delay to the clock signal which is applied to phase detector 12. As a result of the additional delay provided by delay circuit 16, the time margin is shifted by a value TD zero. By selecting the variable delay of delay circuit 17, TD0, to be less than the fixed delay of delay circuit 16, the effective delay of the VCO 14 output provided by variable delay network 17 is TD-TD0. Accordingly, the phase of the signal shown in FIG. 2, as F, can be adjusted to that it coincides with the new time reference. The edge of the clock signal from VCO 14 can thereafter be adjusted, with respect to the new time reference, depending on the control signal $V_{con}$ provided by the skew controller 19.

The correction voltage for eliminating the skew between the sine reference signal A and delayed clock signal F is derived, in accordance with the preferred embodiment, from a skew controller 19 which receives an error signal, representing the skew between the sine reference signal and clock signal D. The skew controller 19 includes a skew calibrating algorithm which generates a correction voltage based on signal to noise (SNR) information derived from a Sin DAC 18. The Sin DAC 18 has at least a significant bit output, representing the signal to noise ratio of an analog quantity converted from a digital input. In practice, the digital input G is set to zero, and the digital to analog converter output changes in accordance with its least significant bit.

Figure 3:
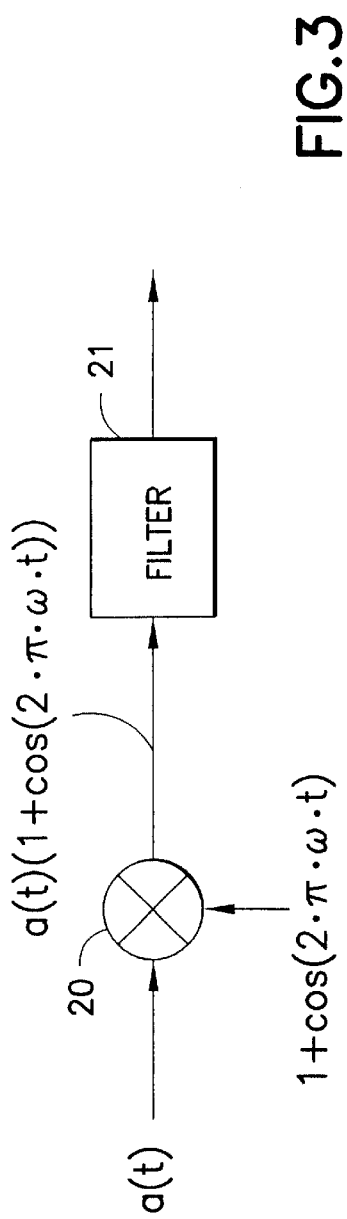
FIG. 3 illustrates the architecture of the SIN digital to analog converter which is used to generate a signal to noise ratio signal.

The architecture for the previously known Sin DAC 18 is shown more completely in FIG. 3. Referring now to FIG. 3, a digital signal is shown as one input to a multiplier 20, and a Sine wave signal with a d-c component, 1+cos(2πωt) is shown as a second input to the multiplier 20. The output comprises the product of the digital data signal a(t) and the sine signal 1+cos(2πωt). The Sin DAC 18 provides pulse shaping, wherein the data signal is multiplied with the sine reference signal having the same frequency as the clock for the DAC. The output signal is a pulsed Sin wave, wherein at the zero crossing point, the pulse has a zero slope which minimizes the circuit sensitivity to clock jitter. The output of the multiplier 20 is filtered in a low pass filter 21 to produce an amplitude signal which is representative of the input digital data.

The Sin DAC 18 output voltage signal to noise ratio is adversely affected by clock skew. As the clock skew increases, the difference in phase between the clock signal applied to the Sine DAC 18 and reference Sine wave signal from Sine source 11, will increase the signal to noise ratio of the analog signal produced by the sine DAC 18. The measure of the signal to noise ratio for the Sine DAC 18 is, therefore, an indication of the measure of skew between the clock signal and reference signal from the Sine signal source 11. In the embodiment shown of FIG. 1, the data input G is held to zero, representing an idle input condition and an output signal produced by the Sin DAC 18 is detected, as an indication of the signal to noise ratio and applied to the skew controller 19 wherein each value of SNR is determined as:

$$SNR[k] = \frac{1}{M} \sum_{i=k-M}^{k} |\vec{x}_{noise}|^2,$$

where k is a current sample, M is a running average range and $\vec{x}_{noise}$ is an analog to digital converted output vector of said digital to analog converter having an idle input.

The skew controller 19 produces a control voltage based on the input signal to noise ratio, or some other indicator of the clock skew. The algorithm used to derive a control voltage in accordance with the preferred embodiment, based on signal to noise ratio is given as follows:

$$V_{con}[k+1] = V_{con}[k] + \mu \cdot sign(\Delta SNR[k]) \cdot sign(\Delta SNR[k-1])$$

where $V_{con}$ is the control signal, SNR is a value of said signal to noise ratio signal, and Δ is the difference between k samples of consecutive SNR values.

In the foregoing, each sample instant is represented by K, and the control voltage is updated each sample instant based on the change in signal to noise ratio from the previous sampling instant. A maximum control voltage step change, $\mu$, forms part of the algorithm. The value of $\mu$, the maximum step change size in control voltage, is selected as a tradeoff between resolution and performance.

Figure 4:
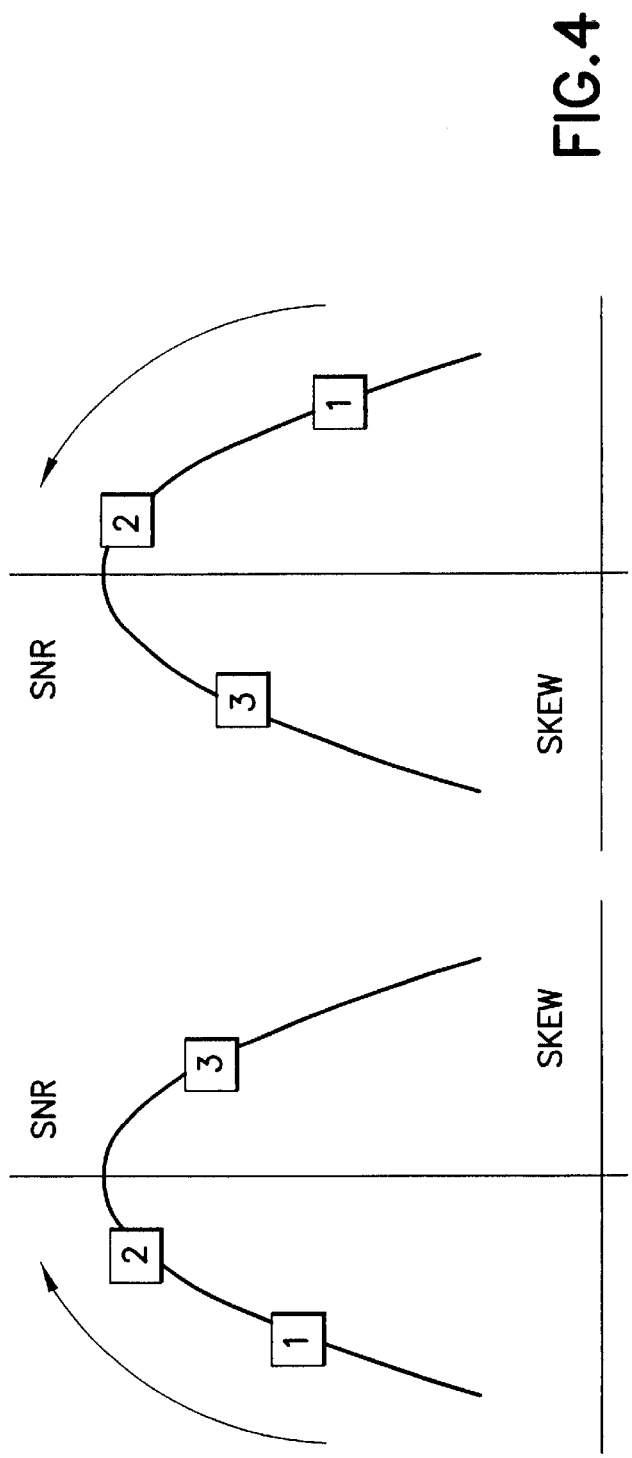
FIG. 4 illustrates the effect of the system on the signal to noise performance.

FIG. 4 illustrates the relationship between the measurement of system performance, i.e., in the preferred embodiment, SNR, whereby position 1 depicts an initial starting point. Once the algorithm has calculated a control voltage based on the measured signal to noise ratio, the next calculated value of control voltage results in a signal to noise ratio of the Sin DAC 18 identified by position 2. The step wise change from position 1 to position 2 is based on the value of $\mu$ and, the system will control the clock skew, such that it operates on either side of the signal to noise ratio peak, represented in FIG. 4. The smaller the value of $\mu$, the less isolation, and smaller the clock skew. To obtain the delay change, of +/− 10 ps, the step size $\mu$ is selected to be +/− 10 mv, with the relationship that 1 ps/mv produces the delay change.

Figure 5:
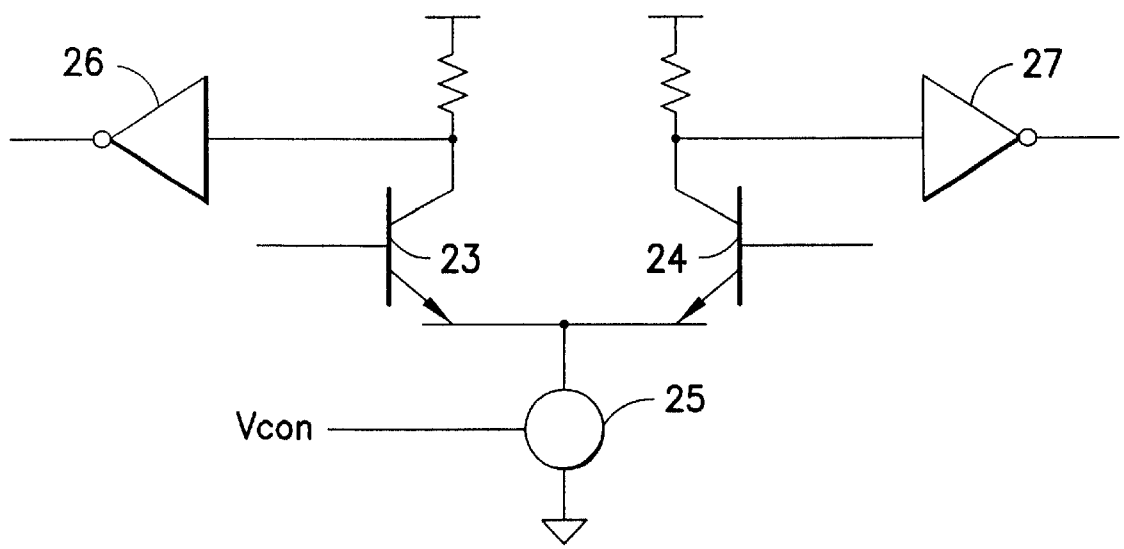
FIG. 5 illustrates the skew controller circuit for adjusting the skew of the clock signal.

The delay circuit 17 is shown, for example, more particularly in FIG. 5. Referring now to FIG. 5, a differential amplifier is shown, receiving as inputs the clock signal $V_{in+}$, and inverted clock signal $V_{in-}$ on the base connections of transistors 23 and 24. The differential transistor pair 23 and 24 are connected in the conventional manner to receive a current from current source 25 which is divided between each of the differential transistors 23 and 24. Control over the current source 25 by the skew calibration circuit increases and decreases the delay of signals $V_{in+}$ and its complement $V_{in-}$. Output driver amplifiers 26 and 27 provide the amplified outputs of a clock signal which has been delayed in accordance with the current level set by current source 25.

Figure 6:
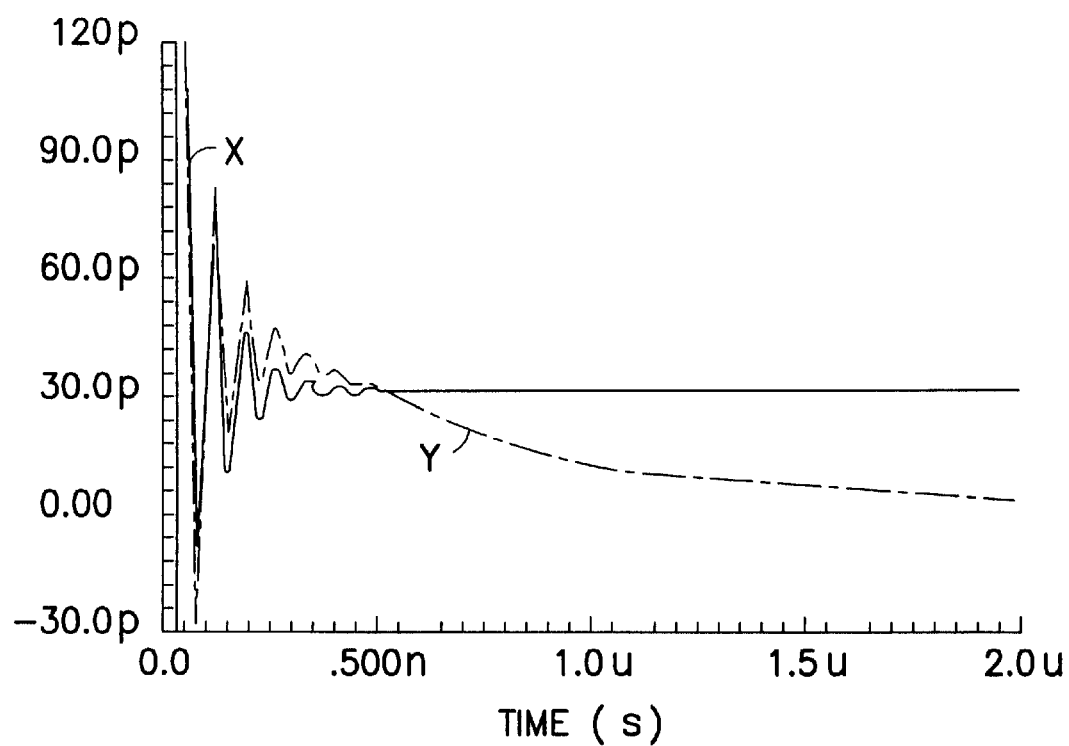
FIG. 6 illustrates the effect of compensating clock skew.

FIG. 6 illustrates the result of controlling skew with respect to the signal to noise ratio. The solid line X shows the skew of approximately 30 picoseconds for a phase lock loop without compensation. The dashed line Y, shows how the skew can be reduced over time to zero, as the skew controller 19 operates to reduce the skew to zero.

Thus, there has been described with respect to one embodiment of the invention a circuit for calibrating skew.

The foregoing description of the invention illustrates and describes the present invention. Additionally, the disclosure shows and describes only the preferred embodiments of the invention but, as mentioned above, it is to be understood that the invention is capable of use in various other combinations, modifications, and environments and is capable of changes or modifications within the scope of the inventive concept as expressed herein, commensurate with the above teachings and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the apended claims be construed to include alternative embodiments.

What is claimed is:

1. An apparatus for correcting clock signal skew rates, comprising:
    a circuit connected to receive a data signal and a delayed clock signal for producing from said data signal a signal to noise ratio signal;
    a skew compensator connected to receive a clock signal and to delay said clock signal in accordance with a skew control signal, and for applying said delayed clock signal to said circuit; and
    a skew controller for receiving said signal to noise ratio signal, and for producing a skew control signal for minimizing said signal to noise ratio signal, said skew control signal including a weighted sum of a series of samples of said signal to noise ratio signal, whereby said delayed clock signal is synchronized to said data signal.

2. The apparatus according to claim 1, wherein said skew controller produces a control signal based upon said signal to noise ratio signal.

3. The apparatus according to claim 1 wherein said skew compensator is a differential amplifier which receives said clock signal and its complement on a pair of inputs, and which has a current control input receiving said measurement signal and varying the current through first and second amplifying transistors and the collector impedances connected to said amplifying transistors whereby a delayed signal is produced by said amplifying transistors.

4. An apparatus for controlling the skew of a clock signal, comprising:
    a source of sine wave reference signals;
    a phase lock loop for generating a clock signal phase locked to said source of sine wave reference signals;
    a variable delay network connected to receive said clock signal and applying a delay to said clock signal proportional to a control signal;
    a digital to analog converter connected to receive a clock signal delayed by said variable delay network, and for receiving said sine wave reference signal, said digital to analog converter producing sine pulses representing a signal to noise ratio which is proportional to the difference in phase between an input clock signal and said sine wave reference signal; and
    a skew controller connected to receive said sign pulses, and generating a control signal for said variable delay network for reducing the phase delay between said clock signal and said sine wave reference signal.

5. The apparatus according to claim 4, wherein said signal representing said signal to noise ratio signal is produced by said digital to analog converter when said converter is receiving no data.

6. The apparatus according to claim 4, wherein said skew controller produces a control signal proportional to the successive values of noise power produced by said digital to analog converter.

7. The apparatus according to claim 4 wherein said skew controller produces a control voltage proportional to:

$$V_{con}[k+1]=V_{con}[k]+\mu \cdot \text{sign}(\Delta SNR[k-1])$$

where $V_{con}$ is the control signal, SNR is a value of said signal to noise ratio signal, and $\Delta$ is the difference between k samples of consecutive SNR values.

8. The apparatus according to claim 7, wherein each value of SNR is determined as:

$$SNR[k] = \frac{1}{M} \sum_{i=k-M}^{k} |\vec{x}_{noise}|^2,$$

where k is a current sample, M is a running average range, and $x_{noise}$ is an output vector of said digital to analog converter having an idle input.

9. A method for producing a clock signal with reduced phase skew, comprising:
    generating a phase locked clock signal using a phase lock loop, said phase lock loop receiving as a reference signal a sine signal; producing a control signal for a clock oscillator which is the difference between said sine signal and a signal from said clock oscillator;
    delaying said clock oscillator signal based upon the difference in phase skew between said clock oscillator signal and said sine reference signal thereby reducing said phase skew;
    wherein said difference in phase skew is determined by determining the signal to noise ratio of a signal produced from a digital to analog converter which uses said delayed clock oscillator signal and said sine reference signal to produce an output signal.

10. The method according to claim 9, wherein said signal to noise ratio is proportional to:

$$SNR[k] = \frac{1}{M} \sum_{i=k-M}^{k} |\vec{x}_{noise}|^2$$

where k is a current sample, M is a running average range, and $x_{noise}$ is an output vector of said digital to analog converter having an idle input.

11. The method according to claim 9, wherein said control signal is determined as:

$$V_{con}[k+1]=V_{con}[k]+\mu \cdot \text{sign}(\Delta SNR[k-1])$$

where $V_{con}$ is the control signal, SNR are consecutive values of said signal to noise ratio, and $\Delta$ is the difference between k samples of consecutive SNR values.

* * * * *